(12) United States Patent
Luo (10) Patent No.: US 9,723,679 B2
(45) Date of Patent: Aug. 1, 2017

(54) COMPUTING APPARATUS AND LED DRIVER

(71) Applicant: Xiaohua Luo, Hangzhou (CN)

(72) Inventor: Xiaohua Luo, Hangzhou (CN)

( * ) Notice: Subject to any disclaimer, the term of this patent is extended or adjusted under 35 U.S.C. 154(b) by 0 days.

(21) Appl. No.: 15/438,398

(22) Filed: Feb. 21, 2017

(65) Prior Publication Data

US 2017/0164444 A1 Jun. 8, 2017

Related U.S. Application Data

(63) Continuation of application No. PCT/CN2015/090213, filed on Sep. 22, 2015.

(30) Foreign Application Priority Data

Oct. 10, 2014 (CN) .................... 2014 2 0584724 U
Nov. 11, 2014 (CN) .......................... 2014 1 0632645
Apr. 20, 2015 (CN) .......................... 2015 1 0187816

(51) Int. Cl.
*H05B 33/08* (2006.01)
*H03K 5/1534* (2006.01)

(52) U.S. Cl.
CPC ....... *H05B 33/0857* (2013.01); *H03K 5/1534* (2013.01)

(58) Field of Classification Search
CPC .... H05B 37/02; H05B 33/08; H05B 33/0857; H03K 5/1534; H03K 2005/00241;

(Continued)

(56) References Cited

U.S. PATENT DOCUMENTS 3,012,723 A * 12/1961 Goertzel ................. G06F 15/78
341/104
2003/0226054 A1* 12/2003 Benno ....................... G06F 1/04
713/500

(Continued)

FOREIGN PATENT DOCUMENTS

CN 104363680 A 2/2015

OTHER PUBLICATIONS

International Preliminary Report on Patentability in PCT/CN2015/090213, mailed Mar. 4, 2017.

(Continued)

*Primary Examiner* — Thai Pham
(74) *Attorney, Agent, or Firm* — Syncoda LLC; Feng Ma; Junjie Feng (57) ABSTRACT

A computing apparatus triggered by input signal edges from a power supply line includes an edge-triggered computing device, a charging device, and an initialization device. The edge-triggered computing device is triggered to compute by the input signal edges from power supply line, and is used to output computing results; the charging device is configured to supply power to the edge-triggered computing device based on the input signals from the power supply line; the initialization device is configured to initialize the edge-triggered computing device based on the voltage of the power supplied by the charging device. An LED driver includes the computing apparatus is to configured to control a driving device according to the computing results, thereby achieving display of light from LEDs using the power supply line and ground line without extra control signal line, and facilitating on-chip implementation of LED driving circuits.

18 Claims, 9 Drawing Sheets

(58) Field of Classification Search
CPC . H03K 2005/00247; G06F 1/04; G11C 19/00;
G09G 3/36; G09G 2310/0286
USPC ....... 315/169.2, 291, 307, 308; 345/98, 100,
345/204
See application file for complete search history.

(56) References Cited

U.S. PATENT DOCUMENTS

2004/0150610 A1\* 8/2004 Zebedee ................ G11C 19/28
345/100
2007/0146290 A1\* 6/2007 Hirama ................ G09G 3/3677
345/100

OTHER PUBLICATIONS

First Office Action in CN Application No. 201510187816.4.
Second Office Action in CN Application No. 201510187816.4.
International Search Report in PCT/CN2015/090213, mailed Dec. 21, 2015.
Su, Chengfu, "The Illuminations Controller", Electronics World, No. 10, Oct. 15, 1998 (Oct. 15, 1998), ISSN: ISSN 1003-0522, p. 31.

\* cited by examiner

COMPUTING APPARATUS AND LED DRIVER

CROSS-REFERENCE TO RELATED APPLICATIONS

The present application is a continuation of, and claims priority to, PCT Application No. PCT/CN2015/090213 filed on Sep. 22, 2015, which in turn claims priority to Chinese Patent Application Nos. CN 201420584724.0 filed on Oct. 10, 2014, CN 201410632645.7 filed on Nov. 11, 2014, and CN 201510187816.4 filed on Apr. 20, 2015. The disclosures of these applications are hereby incorporated by reference in their entirety.

BACKGROUND

Light Emitting Diodes (LEDs) are widely used for architectural lighting, car headlights and taillights, landscape lights, festival decoration, etc. LED as a light source has such advantages as: power-efficient, orientation-controllable, color-display-stable, long serving life, small size, and very safe to use in various environments, and thus is very fit for scenery lighting or festival decoration. Based on three basic colors, red, green and blue, LEDs can display seven or more colors with a controlling apparatus, which can play an important role in the fantastic display effects of the whole lighting system.

In recent years, with the help of integrated circuit technologies and computer technologies, controlling methodologies based on protocols such as DMX512, DALI, Return-To-Zero have been widely used for LED lighting, and have enabled the computerization and improved the flexibility of LED controlling system.

DMX512 was developed by the Engineering Commission of United States Institute for Theatre Technology (USITT) in 1985. Its physical layer uses RS-485 transceiver, and the bus contains a pair of twisted lines to connect the light modulator and the dimming console. DALI is a lighting control bus solution developed in Europe, an open standard asynchronous serial digital communication protocol.

Now there is in market Return-to-Zero Protocol based technologies, which use one independent controlling signal lines to transfer control signals, by rationing the duty cycles of the red, green and blue LEDs to achieve the controlling over various colors.

Although controlling apparatuses based on the above protocols can achieve various colors from rationing the duty cycles of red, green and blue LEDs, they all need one or more independent signal lines for control signals, and cannot control LEDs by power supply line, thus cannot be applied to the situation where there are only the power supply line and the ground line available.

SUMMARY

To solve the problems in current technologies mentioned above, some embodiments disclosed herein provide a computing apparatus configured to be triggered by input signal edges from a power supply line, and an LED driver.

To fulfill the above object, various embodiments disclosed herein provide a computing apparatus configured to be triggered by input signal edges from a power supply line. The computing apparatus comprises an edge-triggered computing device, a charging device and an initialization device: the edge-triggered computing device is configured to be triggered to perform computing by the input signal edges from the power supply line, and is configured to output computing results; the charging device is configured to supply power to the edge-triggered computing device based on the input signals from the power supply line; the charging device is charged if the input signal from the power supply line is at a high voltage, and is discharged if the input signal from the power supply line is at a low voltage; and the initialization device is configured to initialize the edge-triggered computing device based on the voltage of the power supplied by the charging device. The edge-triggered computing device is triggered to perform computations many times by input signal edges from the power supply line. In some embodiments the edge-triggered computing device is triggered to perform one computation by each input signal edge from the power supply line. In some embodiments the edge-triggered computing device is triggered to perform one computation by a plurality of input signal edges from the power supply line.

The functional devices or units of the computing apparatus present in the invention can be integrated into a computing chip.

During an initialization process, the edge-triggered computing device according to some embodiments disclosed herein can be set to any number by initialization according to different requirements, and in general set to be 0 (meaning 'clear').

When the input signal from the power supply line is at a high voltage or beyond the high voltage, the charging device charges, and when the voltage of the power supplied by the charging device arrives at the high voltage level, the edge-triggered computing device and the initialization device are successfully power-on. The transition either from low to high or from high to low of the input signal from the power supply line is the input signal edge from the power supply line.

To ensure that the computing apparatus works properly, the low voltage duration of the input signal from the power supply line must be shorter than the transition time during which the voltage of the power supplied by the charging device drops from high to low.

The edge-triggered computing device does counting, arithmetic, logic or bit shift operations, or any combination of these operations.

In some embodiments, the edge-triggered computing device is an edge counting device, the edge counting device counts triggered by the input signal edges from the power supply line, and outputs the counting results.

The edge counting device comprises a plurality of flip-flops connected in series, and outputs the counting results via the outputs of the plurality of flip-flops.

In some embodiments, the plurality of flip-flops are a plurality of D flip-flops.

A D flip-flop is a digital logic device that stores the status of its D input whenever its clock input makes a certain transition (low to high or high to low). The Q output of D flip-flop shows the currently stored value, and the QB output of D flip-flop shows the inversion of Q output. The Q output is clear when the reset input of D flip-flop is at valid voltage level. The Q output is set when the set input of D flip-flop is at valid voltage level. Also, the Q output is named as the positive outputs, and the QB output of D flip-flop is named as the reverse output.

In some embodiments, the edge counting device comprises a plurality of D flip-flops connected in series, and are configured to output the counting results via the outputs of the plurality of D flip-flops, among which: the clock input of the first D flip-flop of the plurality of D flip-flops is connected to the power supply line; among the remaining D flip-flops of the plurality of D flip-flops, in two adjacent D flip-flops, the clock input of a D flip-flop is connected to the QB output of its preceding D flip-flop; among the plurality of D flip-flops, the reset input of each D flip-flop of the plurality of D flip-flops is connected to the initialization device, and its QB output is connected to its D input for each D flip-flop of the plurality of D flip-flops.

Unless when specifically claimed to be otherwise, the term "the first D flip-flop" used in the present invention refers to the D flip-flop which relates to the lowest bit of the edge counting device. And between two adjacent D flip-flops, "the preceding" refers to the one that relates to the lower bit of the edge counting device, and "the latter" refers to the one corresponding to the higher bit of the edge counting device.

In some embodiments, the edge-triggered computing device does arithmetic or logic computations triggered by input signal edges from the power supply line, and outputs the computing results. The edge-triggered computing device comprises n flip-flops and one k-bit arithmetic and logic calculation unit, and outputs the computing results via the outputs of the n flip-flops. In some embodiments, the flip-flops are D flip-flops.

Arithmetic and logic calculation unit performs operations such as addition, subtraction and multiplication of integers and bit-wise AND, OR, NOT, XOR and other Boolean operations using two source operands. The first group inputs of arithmetic and logic calculation unit input the first source operand, and the second group inputs of arithmetic and logic calculation unit input the second source operand.

In some embodiments, the edge-triggered computing device comprises n D flip-flops connected in parallel and one k-bit arithmetic and logic unit, n and k are integers, and n equals k in value, and the computational results are output via the outputs of the n D flip-flops, among which: the D inputs of the n D flip-flops are connected to the outputs of the arithmetic and logic unit, one to one and bit to bit, low bit to low bit and high bit to high bit; the reset inputs of the n D flip-flops are connected to the initialization device, and the clock inputs are connected to the power supply line; the first group inputs of the arithmetic and logic unit are connected to the Q outputs of the n D flip-flops, bit to bit, low bit to low bit and high bit to high bit, and the second group inputs are configured to receive an external pattern control parameter.

In some embodiments, between the clock inputs of the n D flip-flops and the power supply line the apparatus further comprises filter circuits used to filter out noise from the power supply line.

The arithmetic and logic unit described in the present invention can be an adder circuit, a subtractor circuit, a logic computing circuit, a multiplier circuit, or a divider circuit, or any combination of these circuits. When in application, the external pattern control parameter can either have a fixed value, or have several optional potential values which are to be selected by the use of an external pattern-selection circuit, which sets the value of the second group inputs of the edge-triggered computing device, making the whole device compute in various patterns. By way of an example, the arithmetic and logic unit is an adder circuit, and the value of the external pattern control parameter is $2^m$, where m is an integer no less than 0 and less than n. when m equals 0, the external pattern control parameter equals $2^0$, and the edge-triggered computing device counts by adding 1 for each step; when m equals 1, the external pattern control parameter equals $2^1$, and the edge-triggered computing device counts by adding 2 for each step, meaning the lowest bit in the computing result (in binaries) stays fixed; when m equals 2, the external pattern control parameter equals $2^2$, and the edge-triggered computing device counts by adding 4 for each step, meaning the lowest two bits in the computing result (in binaries) stay fixed.

In some embodiments, in the case the arithmetic and logic unit is an adder circuit, the value of the external pattern control parameter can also be set to be $2^n-2^m$, where m is an integer no less than 0 and less than n. For example, when m equals 0, the external pattern control parameter equals to $2^n-1$, the arithmetic and logic unit counts by adding the $-1$ complement of $2^n$, and the edge-triggered computing device counts by subtracting 1 for each step; when m equals 1, the external pattern control parameter equals to $2^n-2$, the arithmetic and logic unit counts by adding the $-2$ complement of $2^n$, and the edge-triggered computing device counts by subtracting 2 each step, meaning the lowest bit in the computing result (in binaries) stays fixed; when m equals 2, the external pattern control parameter equals to $2^n-4$, the arithmetic and logic unit counts by adding the $-4$ complement of $2^n$, and the edge-triggered computing device counts by subtracting 4 each step, meaning the lowest two bits in the computing result (in binaries) stay fixed.

By introducing the external pattern control parameter, various optional computing patterns can be achieved, making the control of LED color lights more flexible, and have a more competitive edge in the field of colorful LED lights control.

Unless when specifically claimed to be otherwise, the outputs of the edge-triggered computing device in the present invention include high bit and low bit outputs. "The first D flip-flop" refers to the D flip-flop that relates to the lowest bit output of the edge-triggered computing device. And between two adjacent D flip-flops, the one that relates to the lower bit of the edge-triggered computing device is called the preceding flip-flop, and the one that relates to the higher bit is called the next flip-flop. Accordingly, the first group inputs and the second group inputs of the arithmetic and logic unit also comprise high bit inputs and low bit inputs.

In some embodiments, the edge-triggered computing device is an edge-triggered shift device configured to shift bits triggered by the input signal edges from the power supply line, and to output the results of shifting.

The edge-triggered shift device comprises at least two flip-flops and outputs the results of the shift operation via the outputs of the at least two flip-flops. In some embodiments, the at least two flip-flops are at least two D flip-flops.

In some embodiments, edge-triggered shift device comprises at least two D flip-flops connected in series, and outputs shift results via the outputs of the at least two D flip-flops, among which: the D input of the first D flip-flop is connected to the Q output of the last D flip-flop, and except for the first flip-flop, the D input of any of the remaining D flip-flops is connected to the Q output of its preceding D flip-flop; the reset inputs or the set inputs of the at least two D flip-flops are connected to the initialization device, and the clock inputs of all of the at least two D flip-flops are connected to the power supply line.

The edge-triggered shift device in the present invention can be set to any value by initialization, according to different requirements. It only makes sense that at the start point the outputs of the D flip-flops are not identical, otherwise the shifting operation will be meaningless, so the edge-triggered shift device should have at least one D flip-flop whose reset input is connected to the initialization device, and one D flip-flop whose set input is connected to the initialization device. To set a D flip-flop to 0, its reset input should be connected to the initialization device, and its set input should be connected to the invalid voltage level (if the low voltage level is valid, then its set input should be connected to the high voltage level); likewise, to set a D flip-flop to 1, its set input should be connected to the initialization device, and its reset input should be connected to the invalid voltage level. When the input signal from the power supply line is at the high voltage level or beyond the high voltage level, the charging device charges, and when the voltage of the power supplied by the charging device reaches the high level, the edge-triggered shifting device and the initialization device are power-on.

Unless when specifically claimed to be otherwise, the outputs of the edge-triggered shift device in the present invention include high bit and low bit outputs. "The first D flip-flop" refers to the D flip-flop that relates to the lowest bit output of the edge-triggered shift device. And between two adjacent D flip-flops, the one that relates to the lower bit of the edge-triggered shift device is referred as the preceding D flip-flop, and the one that relates to the higher bit is referred as the next D flip-flop.

The flip-flops can either be rising edge triggered flip-flops, or be falling edge triggered flip-flops, optional to meet specific requirements. The D flip-flops can either be rising edge triggered flip-flops, or falling edge triggered flip-flops, optional to meet specific requirements.

The more the number of the flip-flops are, the wider the computing range of the edge-triggered computing device is. In some embodiments, the edge-triggered computing device comprises at least two flip-flops. More preferably, the computing apparatus comprises 3-200 flip-flops.

The charging device comprises a unidirectional conduction component, which conducts when its anode voltage is higher than its cathode voltage, and shuts off when its cathode voltage is higher than its anode voltage. The anode of the unidirectional conduction component is connected to the power supply line, and its cathode is connected to ground via a power storage component, and via the cathode the charging device supplies power to the edge-triggered computing device and the initialization device. The unidirectional conduction component can be one device, or a unidirectional conduction circuit comprising several devices.

Considering the compatibility with the CMOS technology, in some embodiments, the unidirectional conduction component is a diode, and the anode of the diode is connected to the power supply line, and the cathode of the diode is connected to ground via a power storage component, and via the cathode the charging device supplies power to the edge-triggered computing device and the initialization device. In some embodiments, the unidirectional conduction component is an NPN triode whose collector and base are connected to the power supply line, then the emitter of the NPN triode connected to the ground via the power storage component thus forming an equivalent diode. And via the emitter of the NPN triode the charging device supplies power to the edge-triggered computing device and the initialization device. In some embodiments, the unidirectional conduction component can also be a PNP triode, whose collector is connected with its base and then to the ground via a power storage component, thus forming an equivalent diode, whose emitter is connected to the power supply line, and via the collector and the base of the PNP triode the charging device supplies power to the edge-triggered computing device and the initialization device.

The power storage component should be conceived as some electronic component able to charge and discharge. In some embodiments, the power storage component is a charging capacitor or MOSFET. Since the charging capacitor technology is not compatible with the CMOS technology, it is preferred to use an equivalent capacitor formed by a MOSFET whose technology is compatible with the CMOS technology well, making it easier for technology integration, whose source is connected to whose drain, forming an equivalent capacitor.

By the use of the unidirectional conduction component, the charging capacitor's discharge to the power supply line is prevented, lest the instability in the signal edge causes false counting results, and preferably, the unidirectional conduction component is a diode. And by connecting proper terminals of either a NPN triode or a PNP triode, an equivalent diode that prevents discharge can also be formed.

In some embodiments, an LED driver is also provided, which comprises the computing apparatus triggered by input signal edges from a power supply line described above, and a driving device configured to drive the LEDs according to the output computing results of the computing apparatus triggered by input signal edge through power supply line. The driving device can be accomplished using the current available LED driving circuits in market according to driving requirements.

In the present invention, the power supply line is configured to transfer both power and the input signals from the power supply line, and the input signals from the power supply line comprise clock signals. In some embodiments, the clock signals are the input signals from the power supply line. In some embodiments the frequency of the clock signal might be fixed. In some embodiments the frequency of the clock signal might be dynamically changed.

In some embodiments, a method is provided to realize the use of the power supply line to transfer the clock signals. For example, the input signals are transferred by the power supply line. It is thus not necessary to use clock generation circuits in the embodiments, thus simplifies circuit design.

In another aspect, an LED driver is provided including any one computing apparatus described above, and a driving device for driving LEDs based on the computing results of the computing apparatus. The LED driver can be used, for example, for lighting, decoration, display, signage, etc.

Any of the measures like: inserting one or more filter circuits, or one or more delay circuits, or one or more inverse circuits between the power supply line and the clock inputs of D flip-flops; inserting one or more filter circuits, or one or more delay circuits, or one or more inverse circuits between two inputs of which one is connected to the power supply and the other the clock signal input—any of the measures mentioned above is considered to be within the range of the claims of this invention.

BRIEF DESCRIPTION OF DRAWINGS

To more clearly illustrate the embodiments of the disclosure, the following is a brief description of the drawings, which are for illustrative purpose only. For those of ordinary skills in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
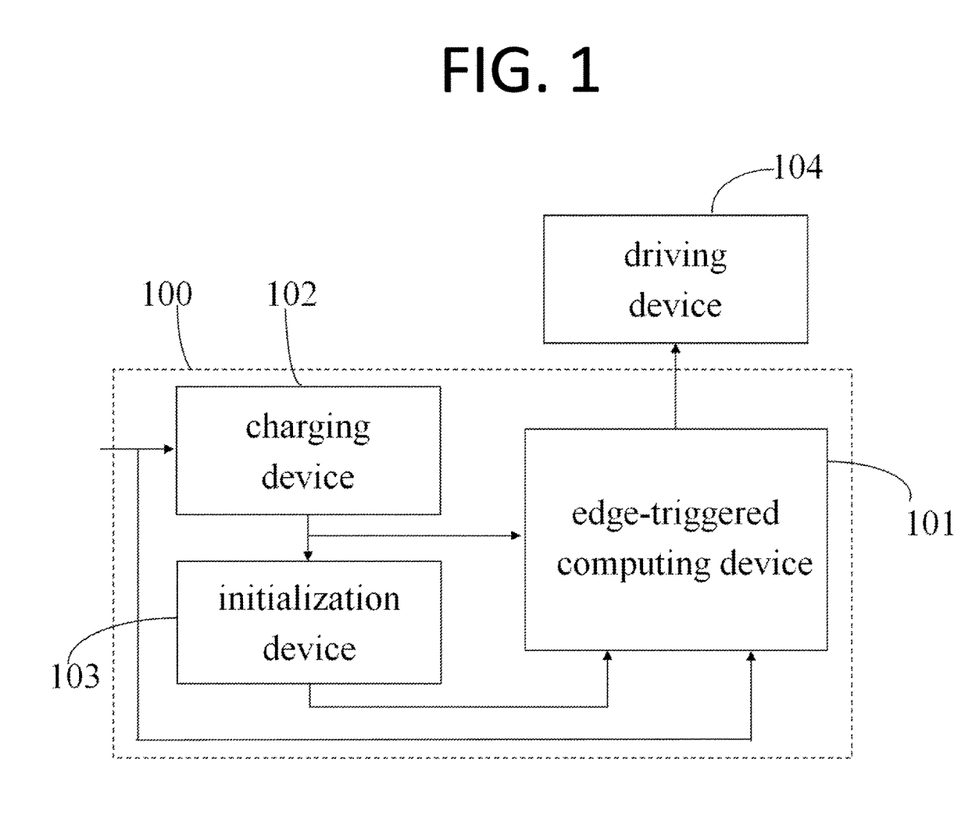
FIG. 1 illustrates a schematic diagram of an computing apparatus triggered by input signal edges from a power supply line.

As illustrated in FIG. 1, an implemented computing apparatus (100) triggered by input signal edges from a power supply line, marked as encircled by the dotted line, comprises: an edge-triggered computing device (101), which is configured to triggered to perform computing by the input signal edges from power supply line, and is configured to output computing results; a charging device (102), which supplies power to the edge-triggered computing device based on the input signals from the power supply line; the charging device is charged when the input signal from the power supply line is at a high voltage or beyond the high voltage, and is discharged when the input signal from the power supply line is at a low voltage; an initialization device (103), which initializes the edge-triggered computing device based on the voltage of the power supplied by the charging device.

First Implementation Example

Figure 2:
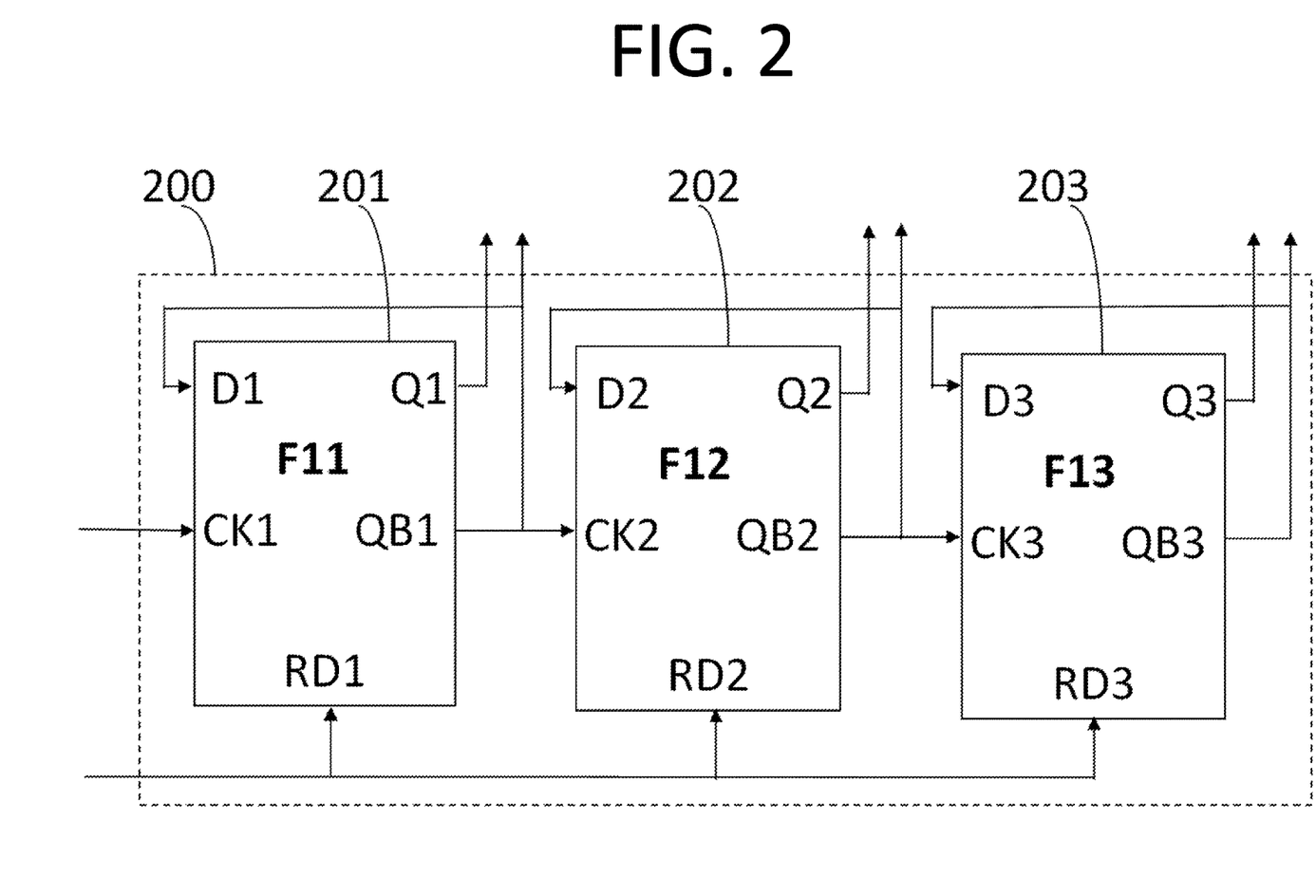
FIG. 2 is an implemented circuit of the edge counting device in the first implementation example.

FIG. 2 illustrates an implemented circuit of an edge counting device (200) in the first implementation example. The edge counting device comprises several positive-edge-triggered D flip-flops with asynchronous reset connected in series, and outputs the counting results via the positive outputs (Q) of these D flip-flops. In first implementation example the edge-triggered counting unit comprises three D flip-flops: the first flip-flop F11 (201), the second flip-flop F12 (202) and the third flip-flop F13 (203), with their positive outputs Q1, Q2 and Q3, and the counting results from low bits to high bits are Q1, Q2 and Q2.

The clock input CK1 of the first D flip-flop (201) is connected to the power supply line, and its reverse output QB1 is connected to the clock input CK2 of the second D flip-flop (202), while the reverse output QB2 of the second D flip-flop is connected to the clock input CK3 of the third D flip-flop (203).

All the reset inputs (meaning the reset input RD1, the reset input RD2 and the reset input RD3) of the D flip-flops are connected to the initialization device (103), and the reverse output of each flip-flop is connected to the its own D input (meaning the reverse output QB1 connected to the D input D1, the reverse output QB2 connected to the D input D2, and the reverse output QB3 connected to the D input D3). All D flip-flops are reset to '0' when the reset inputs are at a low voltage.

The first implementation example counts rising edges using positive-edge-triggered D flip-flops with asynchronous reset.

Figure 3:
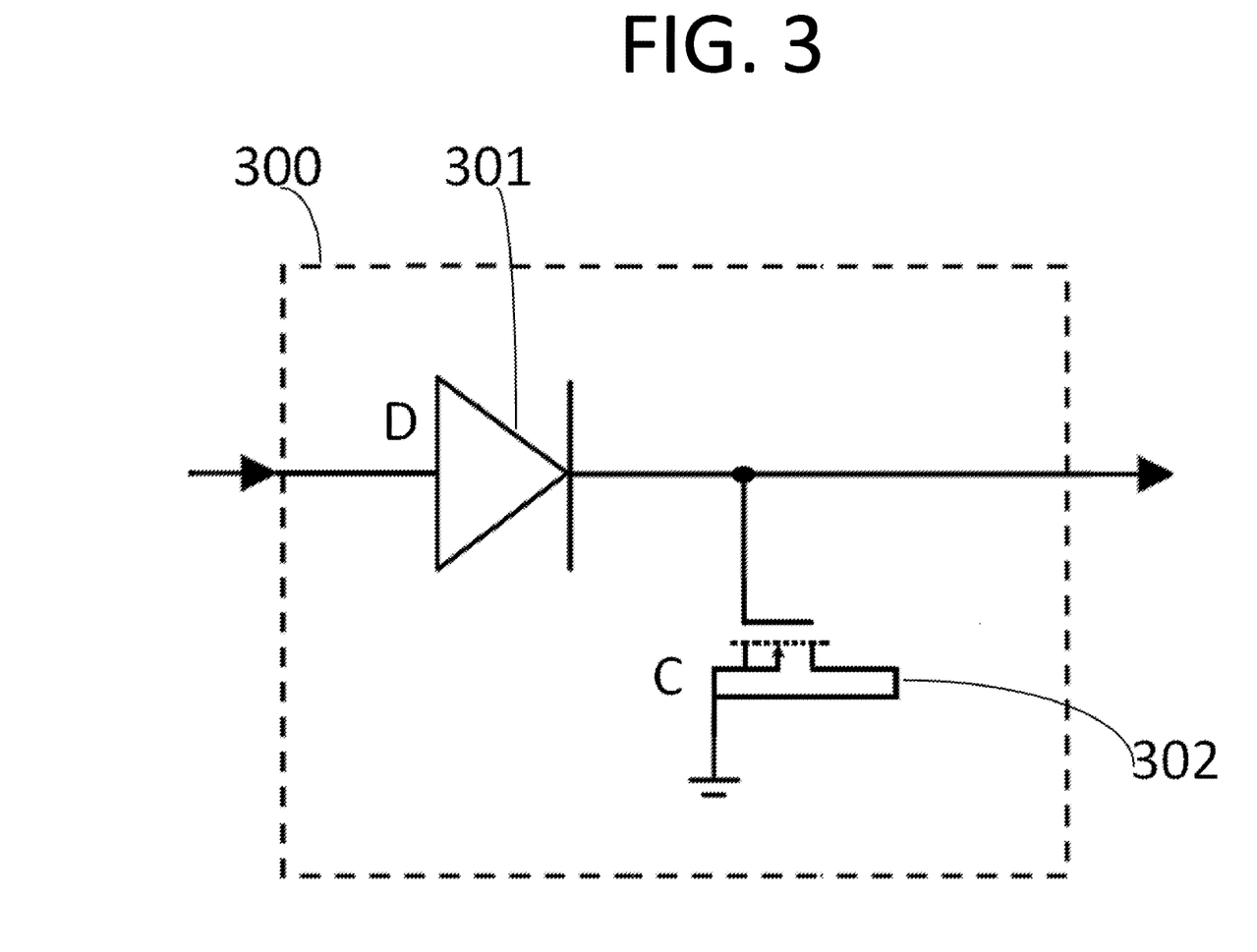
FIG. 3 is an implemented circuit of the charging device of the first implementation example.

FIG. 3 illustrates an implemented circuit of the charging device (300) of the first implementation example, which comprises a diode, D (301), whose anode is connected to the power supply line, and whose cathode is connected to ground via a power storage component C (302) (in the first implementation example the charging capacitor is an equivalent capacitor formed by connecting the source and drain of a MOSFET, whose capacitance is 0.2 μF). The charging device supplies power to the edge-triggered computing device and the initialization device via the cathode of the diode D (301).

Figure 4:
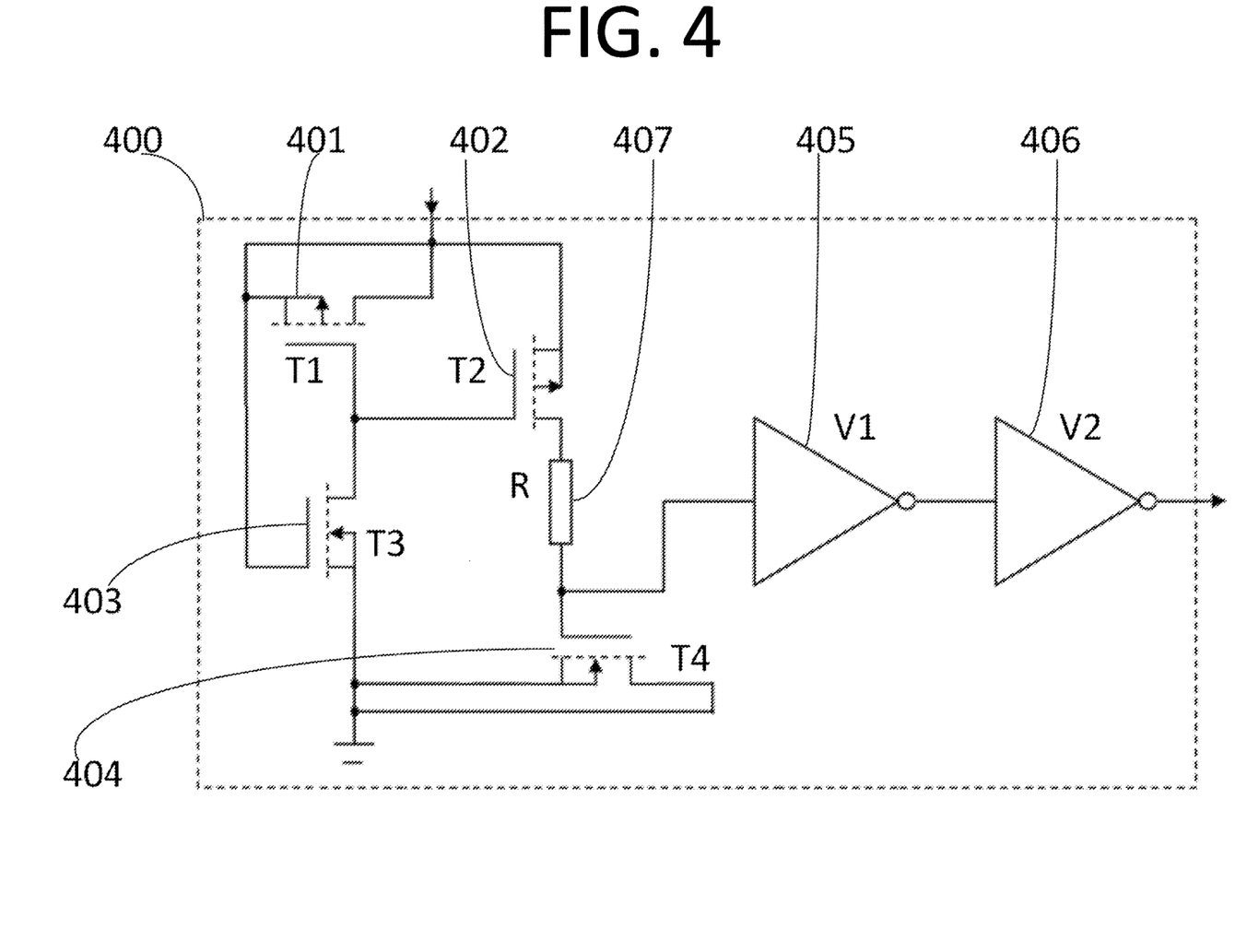
FIG. 4 is an implemented circuit of the initialization device in the first implementation example.

FIG. 4 illustrates an implemented circuit of the initialization device (400) in the first implementation example, which comprises four MOSFETS, including a p-channel MOSFET T1 (401), a p-channel MOSFET T2 (402), a n-channel MOSFET T3 (403), and a n-channel MOSFET T4 (404), the first inverter V1 (405) and the second inverter V2 (406). The connections are followed: the source and drain of the MOSFET T1 (401) are connected to the cathode of the diode D (301) of the charging device, and the gate of T1 (401) is connected to the drain of the MOSFET T3 (403), while the gate of the MOSFET T3 (403) is connected to the source of the MOSFET T1 (401), and the source of T3 (403) is connected to ground. The gate and source of the MOSFET T2 (402) are connected respectively to the gate and source of the MOSFET T1 (401), and the drain of T2 (402) is connected to the gate of the MOSFET T4 (404) via a current limiting resistor R (407) in between, whose value is 500Ω, and the drain and the source of T4 (404) are connected respectively to the source of the MOSFET T3 (403) and ground.

The gate of the MOSFET T4 (404) is connected to the input of the first inverter V1 (405), and the output of V1 (405) is connected to the input of the second inverter V2 (406), and the output of V2 (405) is the output of the initialization device (103), outputting reset signal to the edge-triggered computing device to set the D flip-flops in initialization.

The working principles of the computing apparatus of first implementation example is followed:

When this apparatus is not powered up, the voltage of the power supplied by the charging device is at low level, the initialization device and the edge counting device are insufficiently powered and the whole apparatus does not counting.

When this counting apparatus is power-on, and the input signal is at the high voltage or beyond the high voltage, the power storage component C (302) in the charging device (102) is charged. When the high voltage stays long enough, the voltage of the power supplied by the charging device rises from low to high, so the initialization device and the edge counting device are properly powered.

Thus, the MOSFET T3 (403) in the initialization device is switched on, causing T2 (402) switched on, and the charging device charges the equivalent capacitor MOSFET T4 (404)

via the current limiting resistor R (407). With the charging going on, the voltage level at the gate of T4 (404) rises, and when it becomes high enough to cause the second inverter V2's (406) output signal to switch from low voltage to high voltage, the initialization process completes.

The output of the second inverter V2 (406) is connected to the reset inputs of the edge counting device, and when the second inverter V2 (406) outputs low voltage, the D flip-flops are reset, meaning the edge counting device is cleared to 0.

Figure 5:
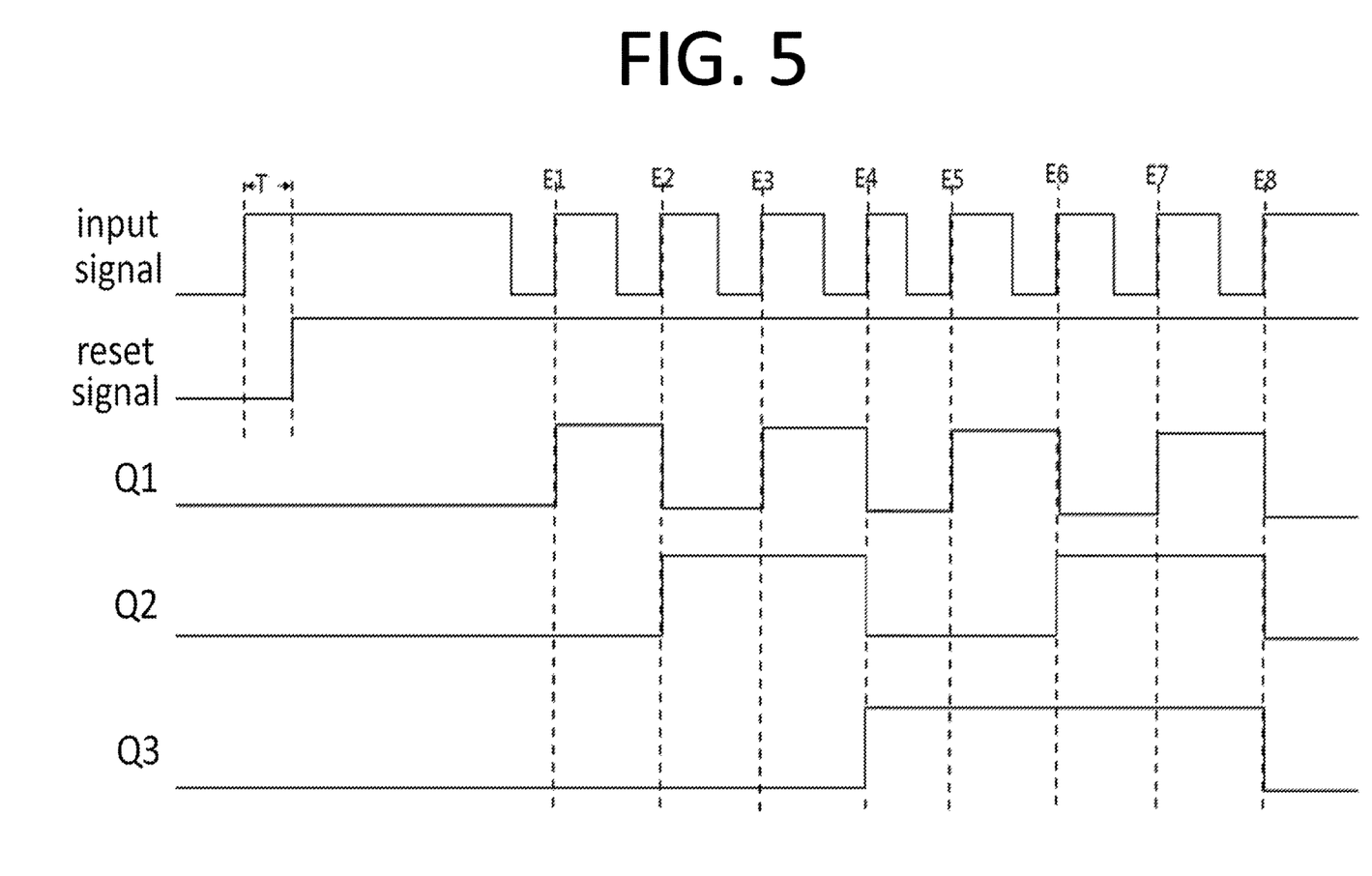
FIG. 5 is the timing diagram of the input signal transferred from power supply line, the counting results, reset signal outputted by initialization device in the first implementation example.

FIG. 5 illustrates the timing diagram of the input signals transferred through the power supply line, the counting results, reset signal outputted by initialization device in the first implementation example, in which the counting results are represented by the three positive outputs of three D flip-flops. After the power is up, at time T the three D flip-flops are reset to logic 0, meaning the counting result is cleared. At the rising edge E1 of the input signal edges from the power supply line, the counting result is 001; and at E2, it is 010; and at E3, it is 011; and at E4, it is 100; and at E5, it is 101; and at E6, it is 110; and at E7, it is 111; and at E8, the counting apparatus overflows, and the counting output is 000.

Second Implementation Example

Figure 6:
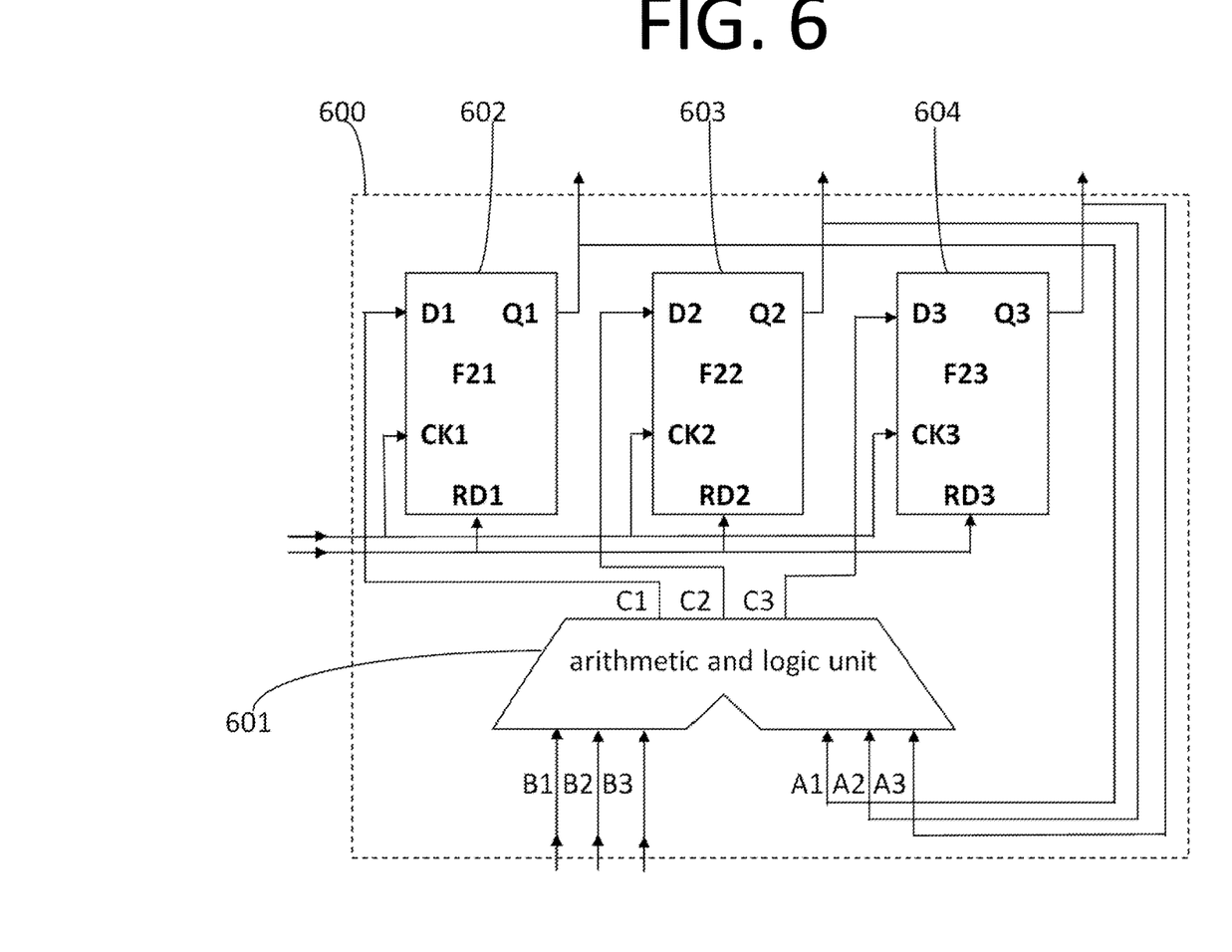
FIG. 6 is an implemented circuit of the edge-triggered computing device in the second implementation example.

FIG. 6 illustrates an implemented circuit of the edge-triggered computing device (600) in the second implementation example of this invention, which comprises 3 D flip-flops connected in parallel and one 3-bit arithmetic and logic unit (601), outputting the counting results via the positive outputs of the D flip-flops.

The D flip-flops in the second implementation example are clock rising edge-triggered flip-flops with low voltage reset input, which are the first D flip-flop F21 (602), the second D flip-flop F22 (603), and the third flip-flop F23 (604), and the corresponding positive outputs are Q1, Q2 and Q3, outputting counting results from low bit to high bit as Q1, Q2 and Q3. The D inputs of the D flip-flops are connected to the outputs of the arithmetic and logic unit bit to related bit correspondingly, meaning D1 to C1, D2 to C2, and D3 to C3.

The reset inputs of the D flip-flops, RD1, RD2 and RD3, are connected to the output of the initialization device (103), and the initialization device (103) resets them by initialization.

The clock inputs of the D flip-flops, CK1, CK2, and CK3, are connected to the power supply line.

The arithmetic and logic unit (601) in the second implementation example is a 3-bit adder, the first group inputs of the 3-bit adder from low bits to high bits are A1, A2, and A3, the second group inputs of the 3-bit adder from low bits to high bits are B1, B2 and B3, and whose outputs from low bits to high bits are C1, C2 and C3. The first group inputs of the 3-bit adder are connected to the outputs of the D flip-flops bit to related bit correspondingly, meaning Q1 to A1, Q2 to A2, and Q3 to A3. The second group inputs of the 3-bit adder are connected to the external pattern control parameter. The external pattern control parameter can be set to meet customer requirements.

The implemented circuit of the charging device in the second implementation example are the same as in the first second implementation example, as shown in FIG. 3.

The implemented circuit of the initialization device in the second implementation example are the same as in the first implementation example, as shown in FIG. 4.

The working principles of the computing apparatus triggered by input signal edges from a power supply line in the second implementation example are shown below:

When this apparatus is power-off, the voltage of the power supplied by the charging device (102) is at the low level, causing the initialization device (103) and the edge-triggered computing device (600) left with insufficient power supply, and the whole apparatus does not compute.

When this apparatus is power-on and the input signal is at the high voltage level, the power storage component C (302) in the charge device (102) is charged. If the high voltage level stays long enough, the supplied voltage of the power level switches from low to high, which makes the initialization device (103) and the edge-triggered computing device (600) properly powered.

Thus the MOSFET T3 (403) of the initialization device (103) is turned on, switching the MOSFET T2 (402) on, and the charging device charges the equivalent capacitor MOSFET T4 (404) via a current limiting resistor R (407).

With the charging of the MOSFET T4 (404) going on, the voltage level at the gate of T4 (404) rises, and when it becomes high enough to cause the second inverter V2's (406) output signal to switch from low voltage level to high voltage level, the initialization process completes.

The output of the second inverter V2 (406) is connected to the reset inputs of the D flip-flops in the edge-triggered computing device (600), and when the second inverter V2 (406) outputs low voltage, the D flip-flops are reset, meaning the edge-triggered computing device (600) is cleared to 0.

Figure 7:
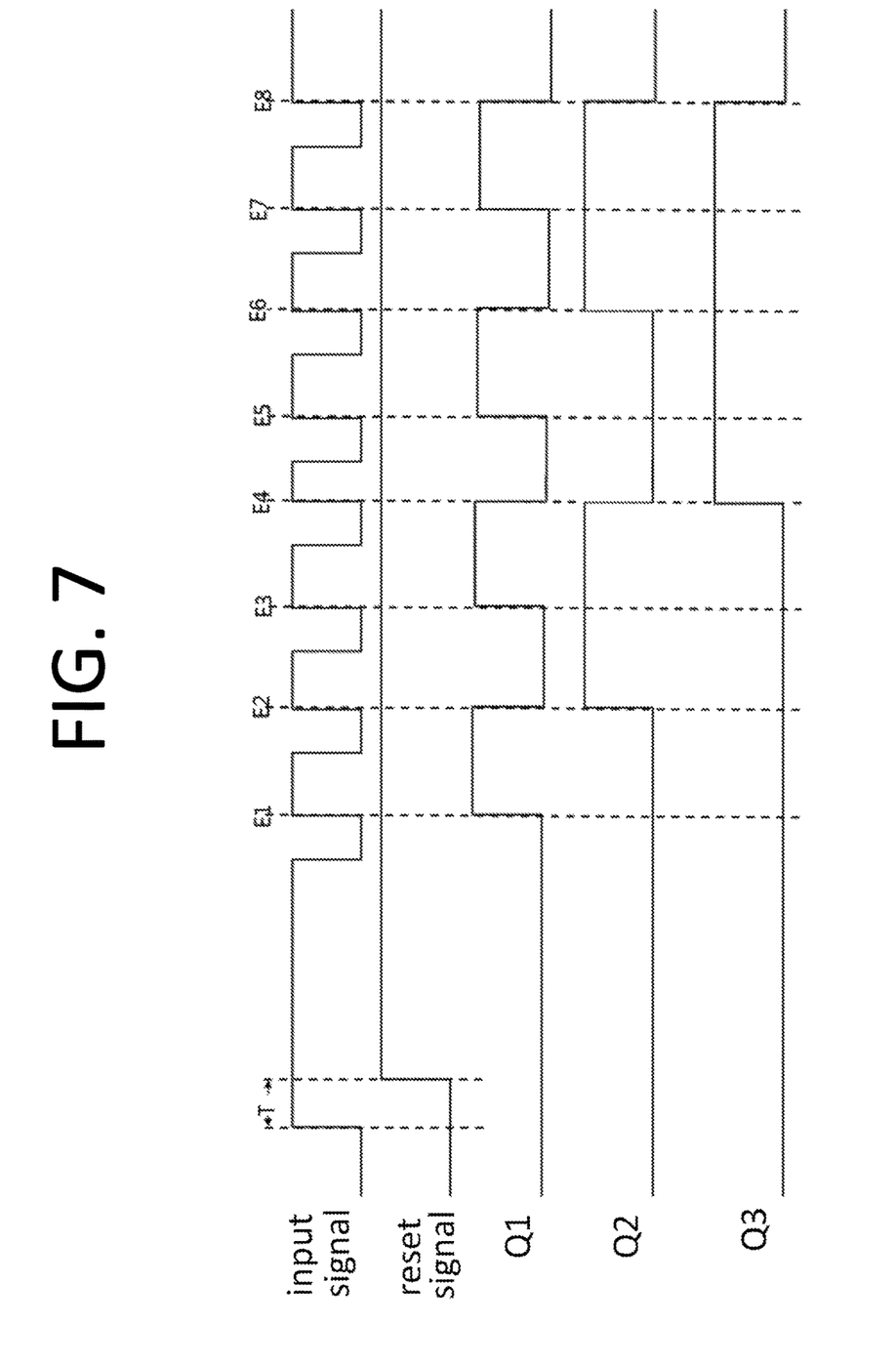
FIG. 7 is the timing diagrams of the input signal transferred from the power supply line, and of the reset signal outputted by the initialization device, and of the computing results in a second implementation example.

FIG. 7 shows the timing diagrams of the input signals transferred through the power supply line, and of the reset signal outputted by the initialization device, and of the computing results when the external pattern control parameter from the second group inputs of the 3-bit adder is set to be the binary value '001', with the computing results presented by the three positive outputs of the D flip-flops. After the power is on, at time T the three D flip-flops are reset to 0, meaning the clearing of previous computing results. And at the rising edge E1 of the input signal, the computing result is 001; at E2, 010; at E3, 011; and at the rising edge E4 of the input signal transferred by the power supply line, the computing result is 100; at E5, 101; at E6, 110; at E7, 111; and at the rising edge E8 of the input signal transferred through the power supply line, the computing apparatus overflows, and the computing result is 000.

Third Implementation Example

Figure 8:
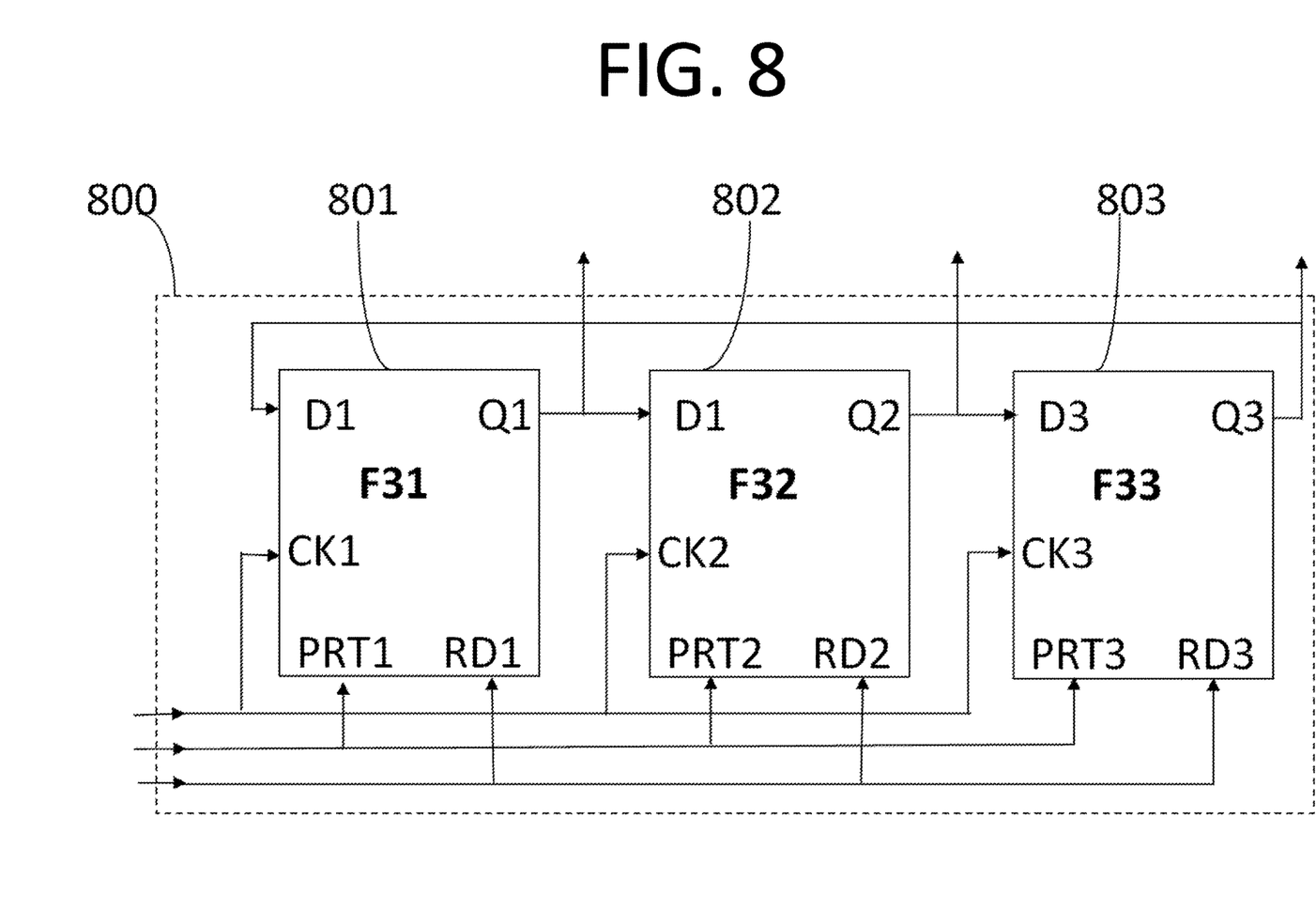
FIG. 8 is an implemented circuit of the edge-triggered shift device in the third implementation example.

FIG. 8 illustrates an implemented circuit of the edge-triggered shift device (800) in the third implementation example of the invention, which is actually an shift device triggered by the input signal edges from power supply line, and comprises 3 D flip-flops connected in series, outputting the shifting results via the outputs of the D flip-flops.

The D flip-flops in the third implementation example are rising edge triggered D flip-flops with low voltage set input and reset input, which are the first D flip-flop F31 (801), the second D flip-flop F32 (802), and the third flip-flop F33 (803), with their respective positive outputs Q1, Q2 and Q3, outputting shifting results from low bits to high bits by Q1, Q2 and Q3.

The D input of the first D flip-flop F31 (801) is connected to the output Q3 of the last D flip-flop F33 (803), and between two adjacent D flip-flops, the D input of the next D flip-flop is connected to the output of the previous D flip-flop, meaning, the D input of the second D flip-flop F32 (802) is connected to the output Q1 of the first D flip-flop F31 (801), and the D input of the third D flip-flop F33 (803) is connected to the output Q2 of the second D flip-flop F32 (802).

The set input PRT1 of the first D flip-flop, the reset input RD2 of the second D flip-flop F32 (802), and the reset RD3 of the third D flip-flop F33 (803) are connected to the output of the initialization device, and the D flip-flops are set by the initialization device through initialization; while the reset input RD1 of the first D flip-flop F31 (801), the set input PRT2 of the second D flip-flop F32 (802), and the set input PRT3 of the third D flip-flop F33 (803) are connected to the output of the charging device, which means they are connected to the high voltage level, the invalid voltage level.

With their clock inputs, CK1, CK2 and CK3 connected to the power supply line, the D flip-flops do shift by bit triggered by the input signal edges transferred from the power supply line, and outputs the shifting results.

The circuit of the charging device in the third implementation example is the same as in the first implementation example, as shown in FIG. 3.

The circuit of the initialization device in the third implementation example is the same as in the first implementation example, as shown in FIG. 4.

The working principles of the computing apparatus triggered by input signal edges from a power supply line in the third implementation example of this invention are shown below:

When this shift apparatus is power-off, the voltage supplied by the charging device is at the low level, leaving the initialization device and the edge-triggered computing device with insufficient power supply, and the whole apparatus does not do any shifting.

When this shift apparatus is power-on and the input signal is at the high voltage or beyond the high voltage, the power storage component C (302) in the charging device (102) is charged. If the high voltage level stays long enough, the supply voltage switches from low to high, making the initialization device and the edge-triggered shift device properly powered.

If the MOSFET T3 (403) of the initialization device is turned on, switching the MOSFET T2 (402) on, and the charging device charges the equivalent capacitor MOSFET T4 (404) via a current limiting resistor R (407). In the process of charging the MOSFET T4 (404), the voltage level at the gate of the MOSFET T4 (404) rises, and when it is high enough to cause the second inverter V2's (406) output reset signal to switch from low voltage level to high voltage level, the initialization process completes.

The output of the second inverter V2 (406) is connected to the reset or set inputs of the D flip-flops in the shift device, and when the second inverter V2 (406) outputs the low voltage level, the D flip-flops are initialized, meaning the shift device is outputting the initialized value.

Figure 9:
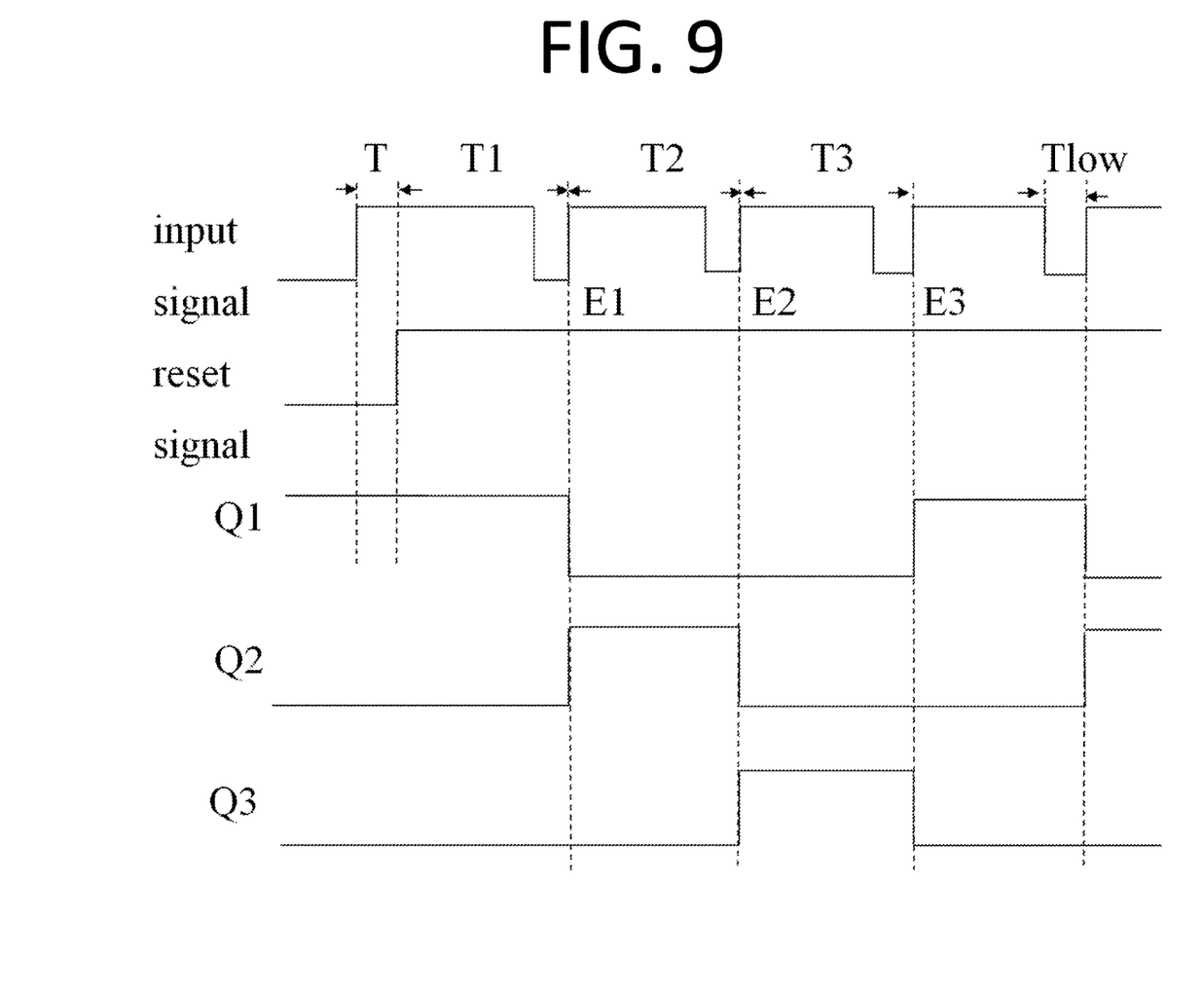
FIG. 9 is the timing diagrams of the input signal transferred from the power supply line, and of the reset signal output by the initialization device, and of the corresponding shifting result in the third implementation example.

FIG. 9 illustrates the timing diagrams of the input signals transferred from the power supply line, and of the reset signal output by the initialization device, and of the corresponding shifting results (Q3, Q2 and Q1), with three positive outputs of the D flip-flops representing the shifting results. After the power is on, at moment T the first D flip-flop F31 (801) is set to 1, the second D flip-flop F32 (802) and the third D flip-flop cleared to 0, meaning the shifting result of the edge-triggered shift unit is initialized to be 001 at moment T. After a time interval T1, at the rising edge E1 of the input signal transferred from the power supply line, the shifting result is 010; And after time interval T2, at the rising edge E2 of the input signal transferred from the power supply line, the shifting result is 100; And after time interval T3, at the rising edge E3 of the input signal transferred from the power supply line, the shift result is 001; the value of Tlow, the duration of the edge signal's low voltage level before the rising edge arrives, is 100 ns in this implementation example. In some embodiments implementation, the value of Tlow may be other value.

To ensure the initialization device and the edge counting device be properly powered in the whole computing process, the low-voltage durations in the edge signal must be shorter than the power storage component C's (302) discharge time during which the output voltage drops from high voltage level to low voltage level.

What's more, due to the unidirectional-conduction feature of the diode, the power storage component will not charge the power supply line with a reverse current when it discharges.

If not specifically claimed, the range of the high voltage described in this implementation example is within 1.2~6V, and the low voltage be less than 1.0V.

The edge-triggered computing device can be used to control the driving device that drives LEDs to display various colors, like when applied to control the display of the red-green-blue-based LED color lights, the signal edge for controlling can be transferred from the power supply line, achieving and controlling the display of over seven colors. The driver schematic is illustrated in FIG. 1, including a computing apparatus triggered by input signal edges from a power supply line according to any one from Claim 1 to Claim 17, and a driving device that drives LEDs according to the counting results from the computing apparatus. The driving device can be implemented by the currently available LED driving circuits, under the condition that the input interface of the driving device is compatible with the output interface of the computing apparatus.

In this implementation of the LED driver, only one line is used to transfer both the input signal edges and the power. By the triggered computation of the input signal edges which is transferred through the power supply line, the controlling device together with the driving device achieves colorful light displays of LEDs, without the need of any extra signal line to transfer the control signal.

The implementation examples described above are just some preferred solutions, which should not be considered the only possible implementations covered by the scope of protection in this invention. Any revised, alternative, equivalent or improved solution, either partly or wholly substituting, added to, or subtracted from the schematics disclosed in this invention, yet working in the same working principles and stemming from the same innovations disclosed in this invention, is considered in the scope of claim of rights of this invention and in the scope of protection, including but not restricted to the following examples: inserting one or more filtering circuits, inserting one or more delay circuits, or inserting one or more inverse circuits between the clock inputs of the flip-flops and the power supply line—these are all considered within the protection scope of this invention.

The methods according to some of the embodiments described above can be realized using a software or program code stored on any type of computer-readable medium or memory, such as a storage device including a disk or hard drive. The computer-readable medium may include a non-transitory computer-readable medium or memory, such as computer-readable media that store data for short periods of time like register memory, processor cache and Random Access Memory (RAM). The computer-readable medium may also include non-transitory media or memory, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example. The software instructions can be stored in the computer readable media, and also be contained in, and provided as, an electronic signal, for example in the form of software as a service (SaaS) delivered from a server (e.g., a distributed system and/or a cloud computing system).

In some embodiments, the methods and functions disclosed herein can be performed on circuitry that is wired to perform the specific logical functions in the process, and the methods can be realized using a processor, an application-specific integrated circuit (ASIC), a field-programmable gate array (FPGA), etc.

Those of ordinary skill in the art will recognize that the functional blocks, methods, units, devices, and systems described in the present disclosure may be integrated or divided into different combinations of systems, units, devices, and functional blocks. Any suitable programming languages and programming techniques may be used to implement the routines of particular embodiments. Different programming techniques may be employed such as procedural or object-oriented. The routines may execute on a single processing device or multiple processors. Although the steps, operations, or computations may be presented in a specific order, the order may be changed in different particular embodiments. In some particular embodiments, multiple steps shown as sequential in this specification may be performed at the same time.

A "processor" includes any suitable hardware and/or software system, mechanism or component that processes data, signals or other information. A processor may include a system with a general-purpose central processing unit, multiple processing units, dedicated circuitry for achieving functionality, or other systems. Processing need not be limited to a geographic location, or have temporal limitations. For example, a processor may perform its functions in "real-time," "offline," in a "batch mode," etc. Portions of processing may be performed at different times and at different locations, by different (or the same) processing systems. Various embodiments disclosed herein can be realized via hardware and/or software, such a computer program stored on a memory. For example, a tangible, non-transitory, computer-readable storage medium having instructions stored there on that, when executed by one or more processors, cause the one or more processors to perform operations including the steps described above.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the invention, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A computing apparatus configured to be triggered by input signal edges from a power supply line, comprising an edge-triggered computing device, a charging device, and an initialization device, wherein:
   the edge-triggered computing device is configured to be triggered to perform computing by the input signal edges from the power supply line, and is configured to output computing results;
   the charging device is configured to supply power to the edge-triggered computing device based on the input signals from the power supply line;
   the charging device is charged when the input signal from the power supply line is at a high voltage, and is discharged when the input signal from the power supply line is at a low voltage; and
   the initialization device is configured to initialize the edge-triggered computing device based on the voltage of the power supplied by the charging device.

2. The apparatus of claim 1, wherein the edge-triggered computing device is an edge counting device configured to count edges of the input signals from the power supply line, and to output counting results.

3. The apparatus of claim 2, wherein the edge counting device comprises a plurality of flip-flops, and outputs the counting results via the outputs of the plurality of flip-flops.

4. The computing apparatus of claim 3, wherein the plurality of flip-flops are a plurality of D flip-flops.

5. The apparatus of claim 4, wherein the plurality of D flip-flops are connected in series, and are configured to output the counting results via the outputs of the plurality of D flip-flops, wherein:
   the clock input of the first D flip-flop of the plurality of D flip-flop is coupled to the power supply line, and among the remaining D flip-flops of the plurality of D flip-flops, the clock input of a D flip-flop is connected to the QB output of its preceding D flip-flop;
   among the plurality of D flip-flops, the reset input of each D flip-flop of the plurality of D flip-flops is connected to the initialization device, and for each D flip-flop of the plurality of D flip-flops its QB output is connected to its D input.

6. The apparatus of claim 1, wherein the edge-triggered computing device is configured to perform arithmetic or logic computations triggered by the input signal edges from the power supply line, and to output the computing results.

7. The apparatus of claim 6, wherein the edge-triggered computing device comprises n flip-flops, and one k-bit arithmetic and logic unit, and outputs the computing results via the outputs of the n flip-flops.

8. The apparatus of claim 7, wherein the flip-flops are D flip-flops.

9. The apparatus of claim 8, wherein:
   the n D flip-flops are connected in parallel;
   n and k are integers, and n=k;
   the computational results are output via the outputs of the n D flip-flops;
   the D inputs of the n D flip-flops are connected to the outputs of the arithmetic and logic unit, one to one and bit to bit, low bit to low bit and high bit to high bit;
   the reset inputs of the n D flip-flops are connected to the initialization device;
   the clock inputs are connected to the power supply line;
   the first group inputs of the arithmetic and logic unit are connected to the Q outputs of the n D flip-flops, bit to bit, low bit to low bit and high bit to high bit; and the second group inputs of the arithmetic and logic unit are configured to receive external pattern control parameter.

10. The apparatus of claim 9, further comprising filter circuits between the clock inputs of the n D flip-flops and the power supply line.

11. The apparatus of claim 1, wherein the edge-triggered computing device is an edge-triggered shift device, configured to shift bits triggered by the input signal edges from the power supply line, and to output the results of shifting.

12. The apparatus of claim 11, wherein the edge-triggered shift device comprises at least two flip-flops and outputs the results of the shift operation via the outputs of the at least two flip-flops.

13. The apparatus of claim 12, wherein: the at least two flip-flops are at least two D flip-flops.

14. The apparatus of claim 13, wherein:
the at least two D flip-flops are connected in series;
the D input of the first D flip-flop of the at least two flip-flops is connected to the Q output of the last D flip-flop of the at least two D flip-flops, and except for the first flip-flop, the D input of any one of the remaining D flip-flops is connected to the Q output of its preceding D flip-flop;
the reset inputs or the set inputs of all of the at least two D flip-flops are connected to the initialization device, and the clock inputs of all of the at least two D flip-flops are connected to the power supply line.

15. The apparatus of claim 1, wherein:
the charging device comprises a unidirectional conduction component;
the anode of the unidirectional conduction component is connected to the power supply line;
the cathode of the unidirectional conduction component is connected to ground via a power storage component;
the charging device supplies power to the edge-triggered computing device and the initialization device via the cathode.

16. The apparatus of claim 15, wherein:
the unidirectional conduction component is a diode;
the anode of the diode is connected to the power supply line;
the cathode of the diode is connected to ground via the power storage component; and
via the cathode the charging device supplies power to the edge-triggered computing device and the initialization device;
alternatively:
the unidirectional conduction component is an NPN triode with the collector and the base connected to the power supply line, and then the emitter of the NPN triode connected to the ground via the power storage component, via the emitter of the NPN triode the charging device supplies power to the edge-triggered computing device and the initialization device;
alternatively:
the unidirectional conduction component is a PNP triode with the collector connected with the base and then to the ground via the power storage component;
the emitter of the PNP triode is connected to the power supply line; and
via the collector and the base of the PNP triode the charging device supplies power to the edge-triggered computing device and the initialization device.

17. The apparatus of claim 16, wherein the power storage component comprises a charging capacitor or a MOSFET.

18. An LED driver, comprising a computing apparatus, and a driving device for driving LEDs based on the computing results of the computing apparatus, wherein:
the computing apparatus configured to be triggered by input signal edges from a power supply line, comprising an edge-triggered computing device, a charging device, and an initialization device;
the edge-triggered computing device is configured to be triggered to perform computing by the input signal edges from the power supply line, and is configured to output computing results;
the charging device is configured to supply power to the edge-triggered computing device based on the input signals from the power supply line;
the charging device is charged when the input signal from the power supply line is at a high voltage, and is discharged when the input signal from the power supply line is at a low voltage; and
the initialization device is configured to initialize the edge-triggered computing device based on the voltage of the power supplied by the charging device.

* * * * *